United States Patent
Okawa et al.

(10) Patent No.: US 9,150,411 B2
(45) Date of Patent: Oct. 6, 2015

(54) FUSING METHOD OF SUBSTRATE LAYER, MANUFACTURING METHOD OF MICROFLUIDIC CHIP AND FUSING APPARATUS OF SUBSTRATE LAYER

(71) Applicants: Sony Corporation, Tokyo (JP); Sony DADC Corporation, Tokyo (JP)

(72) Inventors: Naoki Okawa, Shizuoka (JP); Yukie Suzuki, Shizuoka (JP)

(73) Assignees: SONY CORPORATION, Tokyo (JP); SONY DADC CORPORATION, Tokyo (JP)

( * ) Notice: Subject to any disclaimer, the term of this patent is extended or adjusted under 35 U.S.C. 154(b) by 429 days.

(21) Appl. No.: 13/663,211

(22) Filed: Oct. 29, 2012

(65) Prior Publication Data
US 2013/0115728 A1    May 9, 2013

(30) Foreign Application Priority Data
Nov. 7, 2011    (JP) .................................. 2011-243851

(51) Int. Cl.
   *B29C 65/00*   (2006.01)
   *B81C 3/00*    (2006.01)
   *B29C 65/48*   (2006.01)

(52) U.S. Cl.
   CPC .............. *B81C 3/001* (2013.01); *B29C 65/4895* (2013.01); *B81B 2201/058* (2013.01); *B81C 2201/019* (2013.01); *B81C 2203/037* (2013.01)

(58) Field of Classification Search
   CPC .............. B81C 3/001; B81C 2201/019; B81C 2203/037; B81C 2203/038; B81C 2203/036; B29C 65/4895; B29C 66/036; B29C 66/0344; B29C 66/034; C08J 5/122; B32B 38/0036; B32B 2038/0048
   USPC ......... 156/308.2, 308.6, 308.8, 390, 497, 578
   See application file for complete search history.

(56) References Cited

U.S. PATENT DOCUMENTS

2002/0195196 A1*    12/2002    Peters et al. ................ 156/308.6

FOREIGN PATENT DOCUMENTS

| JP | 2001-242138 | 9/2001 |
|---|---|---|
| JP | 2004-219199 | 8/2004 |

OTHER PUBLICATIONS

"Solvent assisted bonding of polymethylmethacrylate: Characterization using the response surface methodology" Umbrecht et al. pp. 121-128 2009.*

* cited by examiner

*Primary Examiner* — John Goff
(74) *Attorney, Agent, or Firm* — K&L Gates LLP (57) ABSTRACT

Provided is a fusing method of a substrate layer including: treating a joining surface of a substrate layer formed from a resin using an organic solvent having solubility with respect to the resin; and heating the treated substrate layer at less than a glass transition temperature or a softening point temperature of the resin and crimping the heated substrate layer.

9 Claims, 7 Drawing Sheets

FUSING METHOD OF SUBSTRATE LAYER, MANUFACTURING METHOD OF MICROFLUIDIC CHIP AND FUSING APPARATUS OF SUBSTRATE LAYER

CROSS REFERENCES TO RELATED APPLICATIONS

The present application claims priority to Japanese Priority Patent Application JP 2011-243851 filed in the Japan Patent Office on Nov. 7, 2011, the entire content of which is hereby incorporated by reference.

BACKGROUND

The present application relates to a fusing method of a substrate layer, a manufacturing method of a microfluidic chip and a fusing apparatus of a substrate layer, and particularly to a fusing method of a substrate layer capable of performing superimposition of substrate layers by preventing deformation of a region formed on the substrate layer.

In recent years, by applying micro machining technologies in the semiconductor industry, a microfluidic chip having wells or flow paths for performing chemical and biological analyses on substrates made of silicon or glass has been developed (refer to Japanese Unexamined Patent Application Publication No. 2004-219199).

As an example, a microchip electrophoresis method of performing capillary electrophoresis using a microfluidic chip on which capillaries are formed by preparing a flow path (fine groove) on a plastic substrate layer and superimposing the substrate layer on an additional sheet of the substrate layer has been disclosed (refer to Japanese Unexamined Patent Application Publication No. 2004-219199 and Japanese Unexamined Patent Application Publication No. 2001-242138). The microchip electrophoresis method is used in analyses of chargeable trace substance such as nucleic acids, proteins, viruses, cells, amino acids, sugars, organic acids and ions.

In the microchip electrophoresis method, a microfluidic chip on which a sample introduction flow path and a sample separation flow path are formed so as to be at right angles to each other has been used (refer to FIG. 3 of Japanese Unexamined Patent Application Publication No. 2004-219199). In the microfluidic chip, an electrode is formed in the vicinity of an end point of the sample separation flow path using a printing method, a vapor deposition method, an etching method, a plating method or the like, and conductive path wiring for electrophoresis is performed (refer to Japanese Unexamined Patent Application Publication No. 2001-242138).

SUMMARY

A microfluidic chip having regions such as wells or fluid paths is manufactured by superimposing substrate layers having the regions formed. In a case of using a plastic substrate layer, the superimposition may be performed by heating and crimping the heated substrate layer up to the glass transition temperature or the softening point temperature of a resin.

However, in a thermal compression method in the related art, there are cases where the regions formed on the substrate layer are deformed due to pressure during crimping. In addition, when lowering the temperature during crimping in order to prevent deformation of the region formed on the substrate layer, the softening of the resin may be insufficient and joining may be not be completed. Especially in a case where an electrode is formed at a joining surface of the substrate layer, the joining has a tendency not to be complete in the vicinity of the electrode which is convex at the joining surface and a gap may be formed at a joining interface.

Therefore, it is desirable to provide a fusing method of a substrate layer capable of performing superimposition of the substrate layer by preventing deformation of a region formed.

In order to solve the above problems, the present disclosure provides a fusing method of a substrate layer including the following (1) and (2). According to the fusing method, by performing a crimping of the substrate layer after treating a joining surface of the substrate layer using an organic solvent, a temperature during the crimping may be suppressed to less than a glass transition temperature or a softening point temperature of a resin (hereinafter, both temperatures are referred to as "the glass transition temperature").

(1) Treating a joining surface of a substrate layer formed from a resin using an organic solvent having solubility with respect to the resin.

(2) Heating the treated substrate layer through heating at less than a glass transition temperature of the resin and crimping the heated substrate layer.

The fusing method may also include the following (3) and (4). Removing and pressurizing may lead to more complete joining of the substrate layer crimped during the heating and crimping.

(3) Removing the organic solvent remaining on the crimped substrate layer.

(4) Pressurizing the crimped substrate layer after removing the organic solvent while heating at a temperature higher than a heating temperature and lower than the glass transition temperature of the resin in the heating and crimping.

The fusing method is preferably adaptable to a case where a region which becomes a reaction field or an analysis field of a substance is formed on the substrate layer, and is more preferably adaptable to a case where the substrate layer has a minute level difference on the joining surface. As the level difference, what is present between an electrode formed at the joining surface and the surface may be exemplified.

In the treating of the fusing method, the joining surface may be preferably treated using a vaporized form of the organic solvent. In addition, in the heating and crimping and/or the pressurizing, the opposite side surface to the joining surface of the substrate layer may be preferably pressed via a buffer material.

In addition, the present disclosure provides a manufacturing method of a microfluidic chip including the following (1A) and (2A). According to the manufacturing method, a microfluidic chip in which the regions are not deformed may be obtained.

(1A) Treating a joining surface of a substrate layer formed from a resin, where the region which becomes a reaction field or an analysis field of a substance is formed.

(2A) Heating the treated substrate layer at less than a glass transition temperature of the resin and crimping the heated substrate layer.

Furthermore, the present disclosure provides a manufacturing method of a microfluidic chip including the following (1B) to (4B). According to the manufacturing method, a microfluidic chip where a level difference of the joining surface is sealed with the resin may be obtained.

(1B) Treating the joining surface of the substrate layer formed from the resin and having a minute level difference at the joining surface using an organic solvent having solubility with respect to the resin.

(2B) Heating the treated substrate layer at less than a glass transition temperature of the resin and crimping the heated substrate layer.

(3B) Removing the remaining organic solvent on the crimped substrate layer.

(4B) Pressurizing the crimped substrate layer after removing the organic solvent while heating at a temperature higher than a heating temperature and lower than the glass transition temperature of the resin in the heating and crimping.

In conjunction, the present disclosure also provides a fusing apparatus of a substrate layer including a dissolving unit that treats a joining surface of the substrate formed from a resin using an organic solvent having solubility with respect to the resin, a crimping unit that heats the substrate layer treated using the organic solvent at a temperature less than the glass transition temperature of the resin and crimping the heated substrate layer, and a pressurizing unit that pressurizes the crimped substrate layer after removing the organic solvent while heating at a temperature higher than a heating temperature during the crimping and lower than the glass transition temperature of the resin in the crimping unit.

The present application provides a fusing method of a substrate layer capable of performing superimposition of substrate layers through preventing a deformation of a region formed.

Additional features and advantages are described herein, and will be apparent from the following Detailed Description and the figures.

DETAILED DESCRIPTION

Hereinafter, a preferable embodiment to perform the present application is described with reference to the drawings. In addition, an embodiment to be described below represents an example of a representative embodiment of the present application, by which the scope of the present application may not be narrowly understood. The description is made in the following order.

Figure 1:
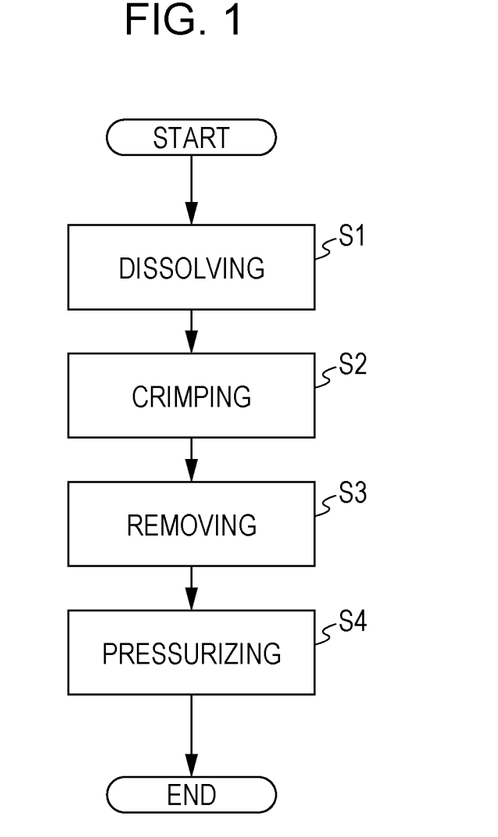
FIG. 1 is a flow chart illustrating procedures of a fusing method of a substrate layer according to the present application.
Figure 2A:
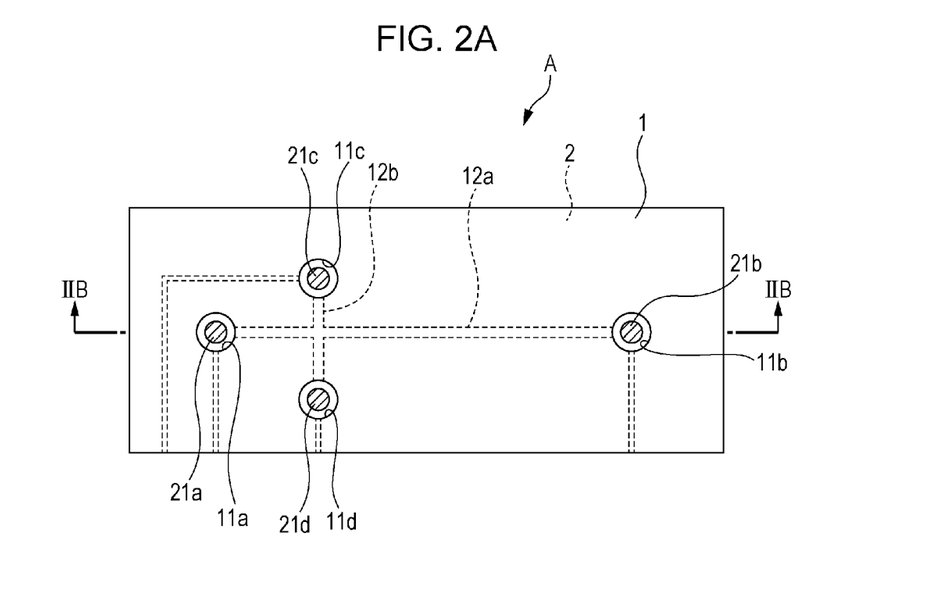
FIGS. 2A and 2B are schematic diagrams illustrating a configuration of a microfluidic chip A to be preferably manufactured using a fusing method of a substrate layer according to the present application.
Figure 2B:
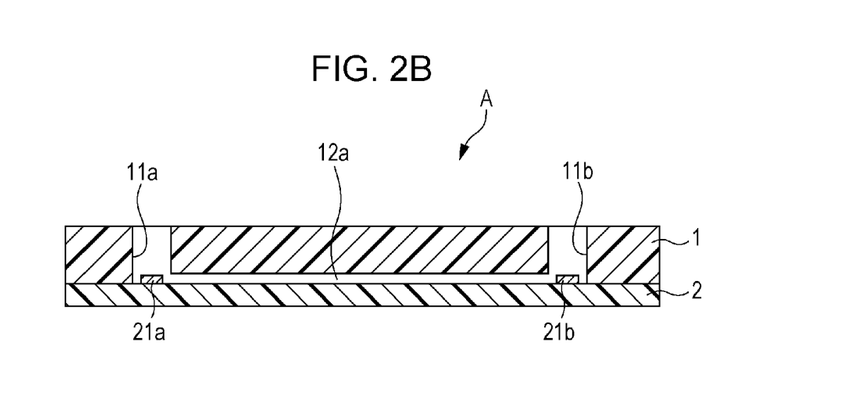
Figure 3:
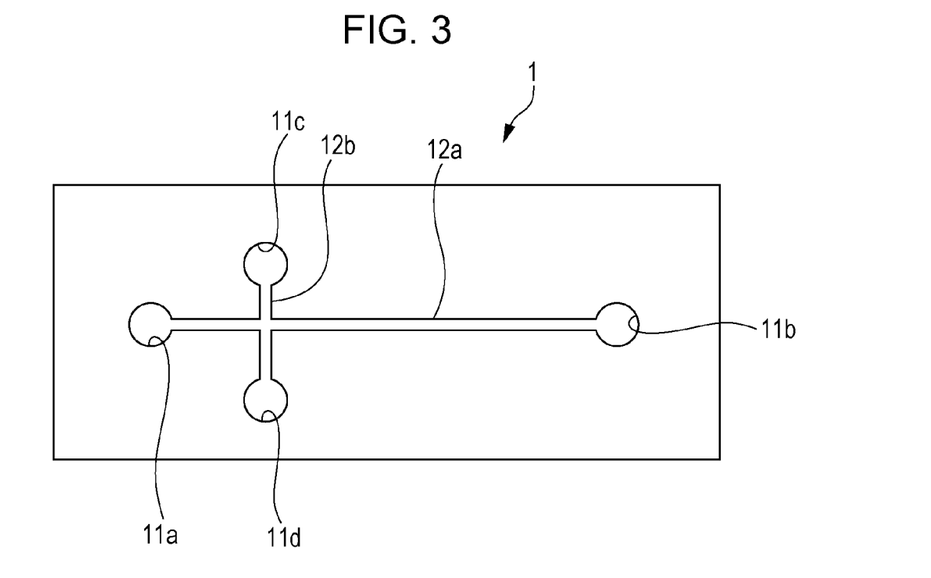
FIG. 3 is a schematic diagram illustrating a configuration of a substrate layer of a microfluidic chip.
Figure 4:
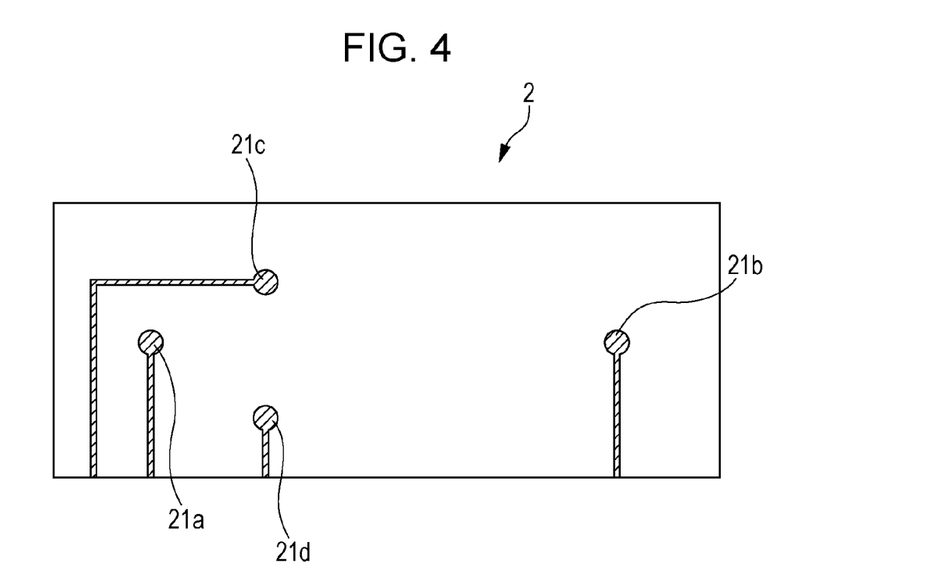
FIG. 4 is a schematic diagram illustrating a configuration of another substrate layer of the microfluidic chip.

1. A microfluidic chip
2. A fusing method of a substrate layer
   (1) Dissolving
   (2) Crimping
   (3) Removing
   (4) Pressurizing
3. A fusing apparatus of a substrate layer
   1. A Microfluidic Chip FIG. 1 is a flow chart illustrating a fusing method of a substrate layer according to the present application. In addition, FIGS. 2A to 4 are schematic diagrams illustrating an example of a microfluidic chip to be preferably manufactured using a fusing method of a substrate layer according to the present application. FIG. 2A, FIG. 3 and FIG. 4 are top view schematic diagrams, and FIG. 2B is a cross sectional schematic diagram corresponding to IIB-IIB cross section in FIG. 2A.

Referring to FIGS. 2A to 4, the microfluidic chip represented by reference numeral A is used in a microchip electrophoresis method and formed by superimposing a substrate layer 1 and a substrate layer 2. The substrate layer 1 has four feed openings 11a, 11b, 11c and 11d penetrated in order to feed a sample. Between a pair of opposing feed openings 11a and 11b, and a pair of opposing feed openings 11c and 11d, groove shaped flow paths 12a (sample separation flow path) and 12b (sample introduction flow path) communicating with the feed openings are formed so as to be at right angles to each other.

The substrate layer 2 has electrodes 21a, 21b, 21c and 21d at positions corresponding to the feed openings 11a, 11b, 11c and 11d of the substrate layer 1. The electrodes 21a, 21b, 21c and 21d become conducting paths for the electrophoresis of the sample inside the flow paths 12a and 12b.

The microfluidic chip A, is manufactured by superimposing a surface on which the electrodes of the substrate layer 2 are formed and a surface on which the flow paths of the substrate layer 1 are arranged in such a manner that the electrodes 21a, 21b, 21c and 21d arranged on the substrate 2 may be respectively located inside the feed openings 11a, 11b, 11c and 11d arranged on the substrate layer 1.

The materials of the substrate layers 1 and 2 may be a plastic used as a material in the related art, such as polypropylene, polycarbonate, polymethyl methacrylate, cycloolefin polymer or polydimethylsiloxane. When optically performing an analysis of a material introduced into the flow paths 12a and 12b or a reaction product thereof, as the material of the substrate layers 1 and 2, it is preferable to select a material with less optical error in order to have an optical transparency, less auto-fluorescence and less wavelength dispersion. As the material of the substrate layers 1 and 2, polycarbonate which also has an excellent heat resistance property in addition to the optical property is more preferable. Furthermore, the materials of the substrate layers 1 and 2 may be either identical or different.

The size of the substrate layers 1 and 2 is not particularly limited but, for example, the substrate layer 1 may be a substrate which is approximately 25 mm in height, 75 mm in width and 1 mm in thickness. The substrate layer 2 may be a sheet or film which is approximately 25 mm in height, 75 mm in width and 50 to 200 μm in thickness.

The feed openings 11a, 11b, 11c and 11d and the flow paths 12a and 12b may be molded on the substrate layer 1 using nanoimprint lithography, injection molding, cutting work or the like. In the feed openings 11a, 11b, 11c and 11d and the flow paths 12*a* and 12*b*, a pillar which is approximately 10 to 500 μm in width and 10 to 300 μm in height may be formed in order to function as a filter when necessary.

The size of the flow paths 12*a* and 12*b* is especially but not limited, for example, the width may be approximately 10 to 500 μm and the depth may be approximately 10 to 300 μm.

As the material of the electrodes 21*a*, 21*b*, 21*c* and 21*d*, especially but not limited to an electrically conducting material such as carbon, gold and silver, carbon is preferably used. The electrode material may not adsorb and deactivate the material introduced into the flow paths 12*a* and 12*b*, and the reaction product thereof. To form the electrodes 21*a*, 21*b*, 21*c* and 21*d* on the substrate layer 2, a printing method, a vapor deposition method, an etching method or a plating method in the related art may be performed.

As for the size of the electrodes 21*a*, 21*b*, 21*c* and 21*d*, especially but not limited, for example, the thickness may be approximately 2 to 10 μm.

2. A Fusing Method of a Substrate Layer

With reference to FIG. 1, obtaining a microfluidic chip A by superimposing substrate layers 1 and 2 is described in order.

(1) Dissolving

The dissolving S1 treats a joining surface of the substrate layers 1 and 2 using an organic solvent having solubility with respect to a resin forming the substrate layers 1 and 2. Here, the joining surface of the substrate layer 1 is a surface on which flow paths 12*a* and 12*b* are formed and the joining surface of the substrate layer 2 is a surface on which electrodes 21*a*, 21*b*, 21*c* and 21*d* are formed. By treating the joining surface using the organic solvent, the joining surface is softened. Thus, a crimping temperature of the substrate layer in the below described crimping S2 may be suppressed to less than a glass transition temperature (melting point) of a resin. In addition, when there is no clear glass transition depending upon the type of the resin, the "glass transition temperature (melting point)" may be replaced with a "softening point temperature (melting point)".

As the organic solvent, according to a material of the substrate layers 1 and 2, a solvent having solubility for the material is appropriately used. For example, the organic solvent used may be tetrahydrofuran, ethyl acetate, chloroform, aceton, methyl chloride, 2-propanol, ethanol, cyclohexane, toluene, xylene, octane or the like. In a case of using a polycarbonate as the material of the substrate layers 1 and 2, chloroform is preferably used as the organic solvent. The organic solvent may not adsorb and deactivate the material introduced into the flow paths 12*a* and 12*b*, and the reaction product thereof.

The treatment using the organic solvent is performed on at least one side of the joining surface of the substrate layer 1 and the joining surface of the substrate layer 2. In order to exclude a possibility that the organic solvent exerts an influence on the electrodes 21*a*, 21*b*, 21*c* and 21*d* formed at the joining surface of the substrate layer 2, the treatment of the organic solvent is preferably performed at the joining surface of the substrate layer 1 only. For this reason, the surface opposite the joining surface of the substrate layer may be preferably protected by film or the like such that it is not in contact with the organic solvent.

The treatment using the organic solvent may be performed by bringing a liquid organic solvent into contact with the joining surface, but may be preferably performed by bringing a vaporized organic solvent into contact with the joining surface. The treatment using the organic solvent may be performed by merely lowering the softening temperature of the resin at the joining interface of the substrate layers 1 and 2.

However, when the treatment is performed using a liquid organic solvent having high solubility of the resin, the organic solvent permeates through up to a deep position from the surface layer of the joining surface of the substrate layers 1 and 2 and softens the resin. Accordingly, a shape change may be caused in the flow paths 12*a* and 12*b* formed on the substrate layer 1 and the solvent crack may occur. In a case of using a liquid organic solvent for the contact, it is preferable to select an organic solvent having low solubility of the resin.

The treatment time using one organic solvent may be appropriately set according to the material of the substrate layer and the organic solvent used. However, if the treatment time is too short, an effect of lowering the crimping temperature in the crimping S2 may not be obtained. If too long, a deformation of the flow paths 12*a* and 12*b* may occur in the crimping S2.

(2) Crimping

In the crimping S2, the substrate layers 1 and 2 after the organic solvent treatment are superimposed so that the joining surfaces of the substrate layers 1 and 2 are faced each other, placed on a hot pressing unit, pressurized and crimped while being heated using a heater. As the joining surface is treated using the organic solvent and softened in the dissolving S1, in this procedure, the substrate layer may be sufficiently joined by thermal compression at less than a glass transition temperature of the resin. As a result, the shape change in the flow paths 12*a* and 12*b*, or the like, which was a problem in the related art, may be prevented in thermal compression close to the glass transition temperature. In addition, since heating is not performed up to the glass transition temperature, twisting and warping do not occur on the substrate layers 1 and 2 after joining and the occurrence of auto-fluorescence of the substrate layers due to thermal cracking of the resin may be also suppressed.

The heating temperature, pressurizing force and pressurizing time may be appropriately set according to the material of the substrate layer and the organic solvent used in the dissolving S1. However, if the temperature, pressure and time are excessively small, the joining of the substrate layer may be insufficient. If excessively large, deformation occurs in the flow paths 12*a* and 12*b*.

In the crimping, the surface of the opposite side to the joining surface of the substrate layers 1 and 2 is pressed via a buffer material. As the buffer material, a member having heat resistance and elasticity such as a heat-resistant fluorine rubber may be used.

Figure 5A:
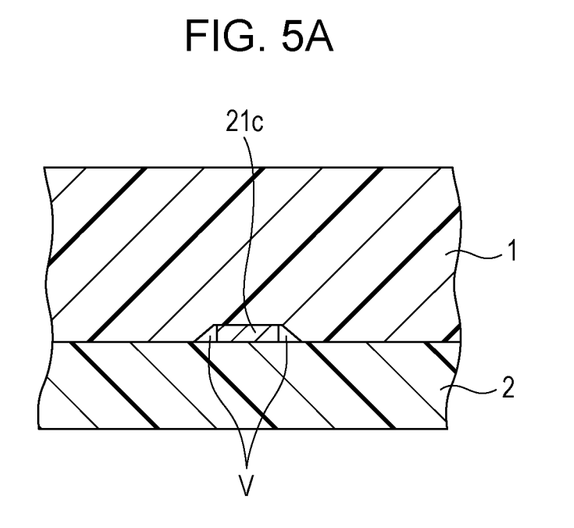
FIGS. 5A and 5B are schematic diagrams illustrating a state (FIG. 5A) in which a gap is present at a joining interface of the substrate layers and a state FIG. 5B where the gap is not present.

At the joining surface of the substrate layer 2, a minute level difference is present because of the electrodes 21*a*, 21*b*, 21*c* and 21*d* formed on the surface. In this case, at the joining interface of the substrate layers 1 and 2, a gap is likely to be formed in the vicinity of convex electrodes. FIG. 5A schematically illustrates a gap (refer to reference numeral V) that is formed in the vicinity of the electrode.

If the gap V appears at the joining interface, the sample introduced into the flow paths 12*a* and 12*b* leaks out from the gap V or without holding electrical insulation properties, the electrophoresis of the sample inside the flow paths 12*a* and 12*b* may not be possible.

Such a gap may appear at the periphery of the joining surface even in a case where a minute level difference appears thereon due to the occurrence of a molding failure, a so-called "burr" or "undercutting" during the molding of the substrate layer. It is understood that a burr is likely to appear at the portion in contact with the molding die of thermoplastic resins during the injection molding of the substrate layer. Even a burr having a convex portion of approximately 2 to 10 μm in height may cause a gap V to appear.

Using the buffer material may prevent the pressure from being concentrated on the convex portion such as the electrode and the burr during the pressing, eliminate non-uniformity on the side pressurized due to the variation of the thickness of the substrate layers 1 and 2 and thereby the gap V is not likely to appear.

In addition, there is a possibility that the gap V still remains even after the crimping. Accordingly, through the below described removing S3 and pressurizing S4, the joining of the substrate layers 1 and 2 may be preferably further completed.

(3) Removing

First, in the removing S3, the organic solvent remaining on the crimped substrate layers 1 and 2 is completely removed. Removing the organic solvent may be performed by natural drying, air-drying or the like. However, removing by placing the crimped substrate layers 1 and 2 inside an oven heated at a higher temperature (approximately 60° C.) than room temperature is preferable.

Through removing the remaining organic solvent, the softening temperature of the substrate layer lowered by the organic solvent may return to the original softening temperature of the resin. In addition, the removing is also necessary for preventing the organic solvent remained inside the microfluidic chip A from causing a solvent crack or whitening.

(4) Pressurizing

Next, in the pressurizing S4, the crimped substrate layers 1 and 2 are pressurized while being heated at a temperature which is higher than the heating temperature in the crimping S2 and lower than the glass transition temperature of the resin. In the pressurizing, pressurization is performed at a higher temperature than the heating temperature in the crimping S2. Therefore, the substrate layer may even be joined at the positions of the gap V remaining at the joining interface of the substrate layers 1 and 2 after the crimping S2.

Figure 5B:
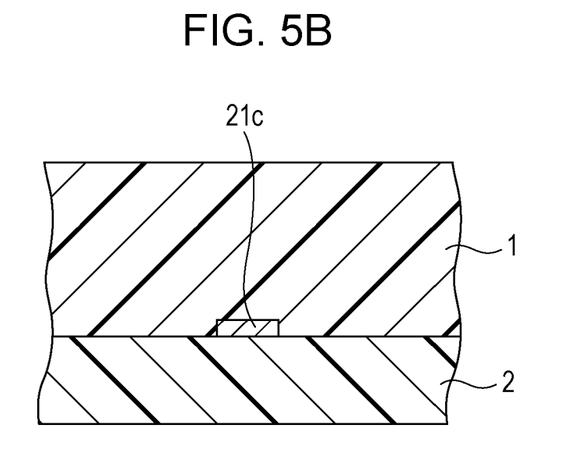

In order to secure liquid tightness and electrical insulation properties in the flow paths 12a and 12b, the resin being completely adhered to at least a portion of the electrode which is convex or the burr, the pressurizing may be performed such that the level difference occurred by the electrode or the burr in the adhering position is completely sealed by the resin (refer to FIG. 5B).

The heating temperature, pressurizing force and pressurizing time may be appropriately set according to the material of the substrate layer. However, if the temperature, pressure and time are excessively insufficient, no effect is expected in eliminating the gap. If excessively enough, deformation occurs in the flow paths 12a and 12b.

Furthermore, in the removing S3, the organic solvent remained on the substrate layers 1 and 2 is removed and the softening temperature of the substrate layer returns to the original softening temperature of the resin. Accordingly, in the pressurizing, even if the pressurizing is performed at a higher temperature than that of the crimping S2, a shape change does not occur in the flow paths 12a and 12b.

Even in the pressurizing, via the buffer material, the surface of the opposite side to the joining surface of the substrate layers 1 and 2 is pressed. Using the buffer material may prevent the pressure from being concentrated on the convex portion such that the gap V does not appear.

As described above, according to the fusing method of the substrate layer related to the present application, in the crimping S2, thermal compression of the substrate layer may be possible at less than the glass transition temperature of the resin and thereby a microfluidic chip where the shape is not changed in the flow path or the like may be obtained. In addition, even in a case where the level difference of approximately several microns such as the electrode or the burr is present in the joining surface of the substrate layers, the resin is fitted to the level difference in the pressurizing S4 and a microfluidic chip where the gap is not present on the level difference portion may be obtained.

3. A Fusing Apparatus of a Substrate Layer

Figure 6:
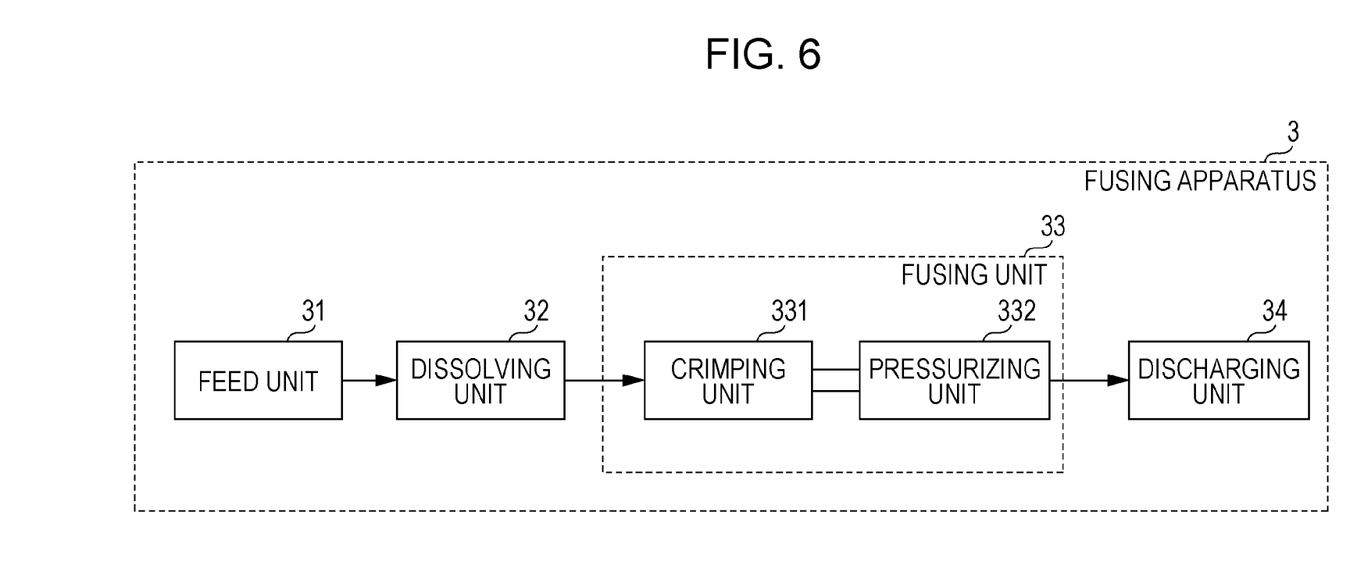
FIG. 6 is a block diagram illustrating a configuration of a fusing apparatus of a substrate layer according to the present application.

FIG. 6 is a block diagram illustrating a configuration of a fusing apparatus of a substrate layer according to the present application. The fusing apparatus represented by reference numeral 3 includes a feed unit 31, a dissolving unit 32, a fusing unit 33, a discharging unit 34 and a mechanism for transporting the substrate layer therebetween. The fusing unit 33 is formed of a crimping unit 331 and a pressurizing unit 332.

The feed unit 31 holds a plurality of substrate layers on which a region such as the flow path and/or the substrate layers to be superimposed thereto. The feed unit 31 sends the held substrate layers to the dissolving unit 32.

The dissolving unit 32 includes a surface treatment device which treats the joining surface of the substrate layer fed from the feed unit 31 using an organic solvent having solubility with respect to the resin forming the substrate layer. The surface treatment device may be an exposure treatment device using the organic solvent in addition to an immersion device, a spray device or the like. It is preferable that the spray device brings the vaporized organic solvent into contact only with the joining surface of the substrate layer. The substrate layer after treatment is sent to the fusing unit 33.

The crimping unit 331 of the fusing unit 33 includes a hot pressing device which crimps the substrate layer conveyed from the dissolving unit 32 through heating at less than the glass transition temperature of the resin. In addition, the pressurizing unit 332 of the fusing unit 33 includes the hot pressing device which pressurizes the substrate layer crimped in the crimping unit 331 while heating at a temperature which is higher than the heating temperature in the crimping unit 331 and lower than the glass transition temperature of the resin. The hot pressing device configuring the crimping unit 331 and the pressurizing unit 332 includes a pressurizing mechanism such as a crimping head which superimposes and pressurizes the joining surfaces of the substrate layers so that the joining surfaces of the substrate layers 1 and 2 are opposed each other, and a heating mechanism such as a heater which heats the pressurizing mechanism. The substrate layer joined in the fusing unit 33 becomes a microfluidic chip and is sent to the discharging unit 34.

The hot pressing devices configuring the crimping unit 331 and the pressurizing unit 332 may be either identical or different. In a case where both units are configured of separate hot pressing devices, a conveying mechanism is provided between the respective devices and a drying mechanism is provided on a conveying route from the hot pressing device of the crimping unit 331 to the hot pressing device of the pressurizing unit 332 in order to remove the organic solvent remained on the substrate layer after crimping in the crimping unit 331. The drying mechanism may be a wind blower, an oven or the like. In addition, in a case where both units are configured of the same hot pressing device, the drying mechanism is provided in the hot pressing device in order to remove the organic solvent remained on the substrate layer during the crimping and the pressurizing.

The fusing method of the substrate layer according to the present application may be also configured as follows.

(1) A fusing method of a substrate layer including: dissolving that treats a joining surface of a substrate layer formed from a resin using an organic solvent having solubility with respect to the resin; and crimping that crimps the treated substrate layer through heating at less than a glass transition temperature.

(2) The fusing method of a substrate layer in the above described (1), further including: removing that removes the organic solvent remaining on the crimped substrate layer; and pressurizing that pressurizes the crimped substrate layer after removing the organic solvent while heating at a temperature which is higher than a heating temperature during the crimping and lower than the glass transition temperature of the resin.

(3) The fusing method of a substrate layer in the above described (1) or (2), wherein a region which becomes a reaction field or an analysis field of a substance is formed on the substrate layer.

(4) The fusing method of a substrate layer in the above described (2) or (3), wherein the substrate layer has a minute level difference at the joining surface.

(5) The fusing method of a substrate layer in the above described (4), wherein the level difference is present between an electrode formed at the joining surface and the surface.

(6) The fusing method of a substrate layer in any one of the above described (1) to (5), wherein in the dissolving, the joining surface is treated using the vaporized form of the organic solvent.

(7) The fusing method of a substrate layer in any one of the above described (1) to (6), wherein in the crimping and/or the pressurizing, via a buffer material, and the opposite side surface to the joining surface of the substrate layer is pressed.

Embodiment 1

1. Manufacturing of a Microfluidic Chip
(1) Manufacturing of a Substrate Layer

The microfluidic chip illustrated In FIGS. 2A to 4 is manufactured for trial. A substrate layer 1 is molded using injection molding. A disk is manufactured in a manner that on, a passage for the flow path is carved out of a nickel plated stainless steel sheet having a sufficient thickness with respect to a depth of flow paths 12a and 12b using an end mill and a periphery of the passage is engraved. The manufactured disk is mounted on an injection molding machine and the substrate layer 1 is molded from polycarbonate resin.

A substrate 2 is manufactured by silk screen printing of the electrodes 21a, 21b, 21c and 21d on the polycarbonate sheet. As a conductive ink, a carbon (Electrodag 423SS, Henkel Japan Ltd.) is used. As for the electrode for capillary electrophoresis, it is preferable to have a surface resistivity of less than 5000 Ω/sq in order to suppress Joule heat generation. For this reason, a relationship between a printing thickness of the conductive ink (thickness of the electrode) and the surface resistivity is examined. The average surface resistivity is 1.39 kΩ/sq when the electrode thickness is 4 μm, is average 2.52 kΩ/sq in the electrode thickness 3.5 μm and is average 4.88 kΩ/sq in the electrode thickness 3 μm. Thus, the electrode thickness is set to be 3.5 μm.

(2) Dissolving and Crimping

Vaporized ethanol, ethyl acetate, tetrahydrofuran and chloroform are applied to a joining surface of the substrate layer 1 (the surface on which the flow paths 12a and 12b are formed). The substrate layer 1 on which a surface opposite the joining surface is masked by a protective film is entered into a treatment container having organic solvent tolerance and the container is sealed. Then, the joining surface is exposed to saturated vapors. Examination is performed under the condition that the treatment temperature is 35° C. and the treatment times are respectively 3, 5, 7, 10, 30, 60, 90, and 120 seconds.

The substrate layer 1 after the organic solvent treatment is superimposed in order for the substrate layer 2 to oppose the joining surface, mounted on a molding die of a hot pressing unit 1, and pressurized, while being heated by a heater. The hot pressing unit 1 has the following configuration.

Upper molding die (substrate layer 1 side): lapped and polished stainless steel sheet Lower molding die (substrate layer 2 side): a buffer material (Kinyo board F200, Kinyosha Co., Ltd.) of 2 mm in thickness is laid on the lapping stainless steel sheet, and another double-sided lapping stainless steel of 0.08 mm in thickness is placed thereon.

After a predetermined time has elapsed, heating by a heater is stopped and the interior of the molding die of the hot pressing unit 1 is water-cooled to decrease the molding die temperature. When the molding die temperature becomes less than 50° C., the pressurizing is stopped and the substrate layer after the fusing is taken out by opening the molding die. The examination is performed under the respective conditions of 120, 240 and 360 seconds pressurizing time. The examination is performed under the respective conditions of 95° C., 100° C., 105° C., 110° C., 115° C., 120° C., 125° C., 130° C., 135° C. and 140° C. molding die temperature. In addition, the examination is performed under the respective conditions of 4.5 kN, 5.0 kN and 5.2 kN pressurizing force.

Under the conditions of a molding die temperature of 100° C. and a pressurizing force of 5.0 kN, when using chloroform as the organic solvent, good bonding of the substrate layers 1 and 2 is confirmed and even a deformation of the flow path shape is not found in solvent treatment time of 7 seconds. In contrast, in treatment time 5 seconds, the bonding of the substrate layers 1 and 2 is weak and in 3 seconds, the bonding is not expected. In addition, in treatment time 10 seconds, deformation of the flow path shape occurs.

Under the same conditions, when using tetrahydrofuran as the organic solvent, in solvent treatment time 30 seconds, a good bonding of the substrate layers 1 and 2 is confirmed and even a deformation of the flow path shape is not found. In contrast, in treatment time 10 seconds or less, bonding of the substrate layers 1 and 2 is not expected. In addition, in treatment time 60 seconds, deformation of the flow path shape occurs.

Under the same condition, when using ethyl acetate as the organic solvent, in solvent treatment time 90 seconds, a good bonding of the substrate layers 1 and 2 is confirmed and even a deformation of the flow path shape is not found. In contrast, in treatment time 60 seconds, bonding of the substrate layers 1 and 2 is weak and in 30 seconds or less, the bonding is not expected. In addition, in treatment time 120 seconds, deformation of the flow path shape occurs.

When using ethanol having no solubility with respect to polycarbonate as the organic solvent, even in solvent treatment time 120 seconds, the substrate layers 1 and 2 are not bonded and an effect of decreasing the pressurizing temperature is not obtained.

In a case of a strong polarity solvent, good bonding of the substrate layers 1 and 2 is obtained even if the treatment time is shortened. However, even if the treatment time is slightly long, deformation of the flow path shape occurs. On the other hand, even if the treatment time is slightly short, a bonding failure occurs. Thus, there is a tendency that the treatment time is difficult to control. In addition, if the adhesion to the substrate layer is carried out to the same degree, a short term treatment using a strong polarity solvent is more preferable than a long term treatment using a weak polarity solvent, and the short term treatment leads to a mild deformation of the flow path shape.

Under the condition of pressuring force 5.0 kN, when using chloroform for 7 seconds, good bonding of the substrate layers 1 and 2 is confirmed at the molding die temperature 100° C. or more. In contrast, under the same condition, when the chloroform treatment is not performed, it is necessary to set the molding die temperature to be 130° C. or more in order to obtain the good bonding. From this point, it is confirmed that the solvent treatment has an effect of decreasing the pressurizing temperature by 30° C.

Figure 7:
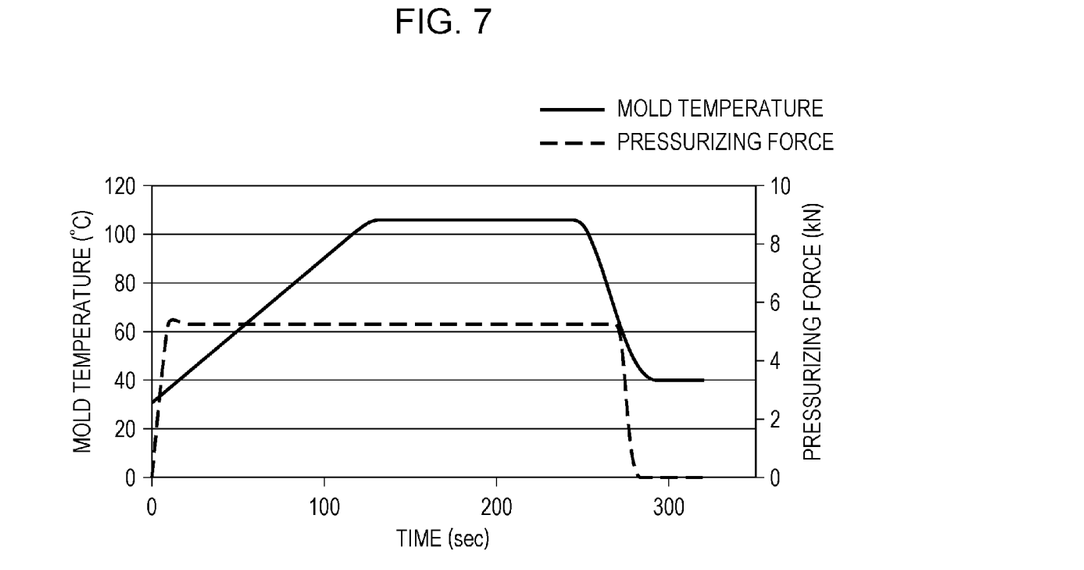
FIG. 7 is a graph as a substitute for a drawing illustrating an example of a change in a pressurizing force and a change in a molding die temperature of a hot pressing unit used in an embodiment.

"Table 1" indicates the results of detailed examination of the molding die temperature, pressurizing force and pressurizing time, under the condition of a chloroform treatment time of 7 seconds. FIG. 7 illustrates a change in the pressurizing force of the hot pressing unit and a change in the molding die temperature in a case where the pressurizing force is set to be 5.2 kN.

TABLE 1

| Molding die temperature (° C.) | Pressurizing force (kN) | Pressurizing time (seconds) | Bonding state | Change in flow path |
|---|---|---|---|---|
| 100 | 4.5 | 120 | No bonding | Not present |
| 100 | 4.5 | 240 | Failure | Not present |
| 100 | 4.5 | 360 | Good | Not present |
| 100 | 5.0 | 360 | Good | Not present |
| 102 | 5.0 | 360 | Good | Not present |
| 103 | 5.0 | 360 | Good | Present |
| 103 | 5.0 | 240 | Failure | Not present |
| 105 | 5.2 | 240 | Good | Not present |
| 106 | 5.2 | 120 | Good | Not present |
| 108 | 5.2 | 120 | Good | Not present |
| 110 | 5.2 | 120 | Good | Present |

(3) Removing and Pressurizing

The microfluidic chip where the substrate layers 1 and 2 are crimped, after being heated in the oven of 60° C. for an hour, is taken out from the oven and naturally cooled up to the room temperature. Thus, the organic solvent remained inside the substrate layer is completely removed.

The microfluidic chip is placed on the molding die of a hot pressing unit 2 and pressurized while being heated. The hot pressing unit 2 has the following configuration.

Upper molding die (substrate layer 1 side): lapping stainless steel sheet

Lower molding die (substrate layer 2 side): on the lapping stainless steel sheet, a buffer material (Kinyo board F200, Kinyosha Co., Ltd.) of 2 mm in thickness is laid and further double-sided lapping stainless steel of 0.2 mm in thickness is placed thereon.

After 60 seconds, heating by the heater is stopped and the interior of the molding die of the hot pressing unit 2 is water-cooled to decrease the molding die temperature. When the molding die temperature becomes less than 50° C., the pressurizing is stopped and by opening the molding die, the microfluidic chip is taken out. The examination is performed under the respective conditions of 110° C., 115° C., 120° C., 125° C. and 130° C. molding die temperature. In addition, the examination is performed under the respective conditions of 4.5 kN, 5.0 kN and 5.5 kN pressurizing force.

Figure 8A:
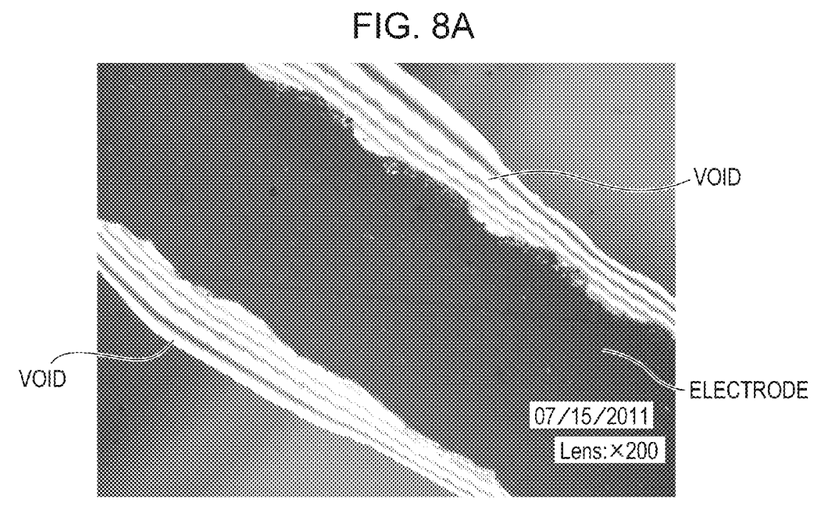
FIGS. 8A and 8B are pictures as a substitute for a drawing where peripheral portions of an electrode prior to pressurizing (FIG. 8A) and after pressurizing (FIG. 8B) of a microfluidic chip manufactured in an embodiment are photographed.
Figure 8B:
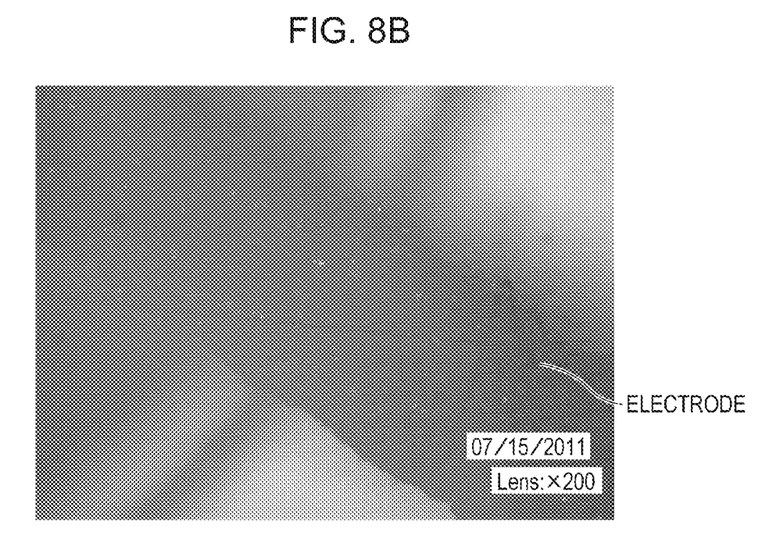

"Table 2" illustrates the results. If the molding die temperature is low, a gap (void) is present in the periphery of the electrode. If the molding die temperature is high, a deformation of the flow path shape is present. FIGS. 8A and 8B illustrate photographs of peripheral portions of the electrode prior to pressurizing (FIG. 8A) and after pressurizing (FIG. 8B).

TABLE 2

| Molding die temperature (° C.) | Pressurizing force (kN) | Gap | Change in flow path |
|---|---|---|---|
| 110 | 5 | present | Not present |
| 115 | 5 | Present | Not present |
| 120 | 4.5 | Present | Not present |
| 120 | 5.0 | Not present | Not present |
| 120 | 5.5 | Not present | Not present |
| 125 | 5.0 | Not present | Not present |
| 125 | 5.5 | Not present | Present |
| 130 | 5.0 | Not present | Present |

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of fusing a first substrate layer and a second substrate layer comprising:
   treating a joining surface of one of the first substrate layer and the second substrate layer formed from a resin using an organic solvent having solubility with respect to the resin;
   heating the first substrate layer and the second substrate layer after the organic solvent treatment at a heating temperature less than a glass transition temperature or a softening point temperature of the resin and crimping the heated substrate layers together;
   removing the organic solvent remaining on the crimped substrate layers; and
   pressurizing the crimped substrate layers after removing the organic solvent while heating at a temperature which is higher than the heating temperature and lower than the glass transition temperature or the softening point temperature of the resin.

2. The method of fusing a first substrate layer and a second substrate layer according to claim 1,
   wherein a region which becomes a reaction field or an analysis field of a substance is formed on the substrate layer treated with the organic solvent.

3. The method of fusing a first substrate layer and a second substrate layer according to claim 2,
   wherein the substrate layer treated with the organic solvent has a minute level difference at the joining surface.

4. The method of fusing a first substrate layer and a second substrate layer according to claim 3,
   wherein the level difference is present between the joining surface and an electrode formed at the joining surface.

5. The method of fusing a first substrate layer and a second substrate layer according to claim 4,
   wherein, in the treating, the joining surface is treated using a vaporized form of the organic solvent.

6. The method of fusing a first substrate layer and a second substrate layer according to claim 5,
   wherein in the heating and crimping and/or the pressurizing, via a buffer material, an opposite side surface to the joining surface of the substrate layer treated with the organic solvent is pressed.

7. A manufacturing method of a microfluidic chip comprising:
   treating a joining surface of one of a first substrate layer and a second substrate layer formed from a resin, having a region which becomes a reaction field or an analysis field of a substance, using an organic solvent having solubility with respect to the resin;

heating the first substrate layer and the second substrate layer after the organic solvent treatment at a heating temperature less than a glass transition temperature or a softening point temperature of the resin and crimping the heated substrate layers together;

removing the organic solvent remaining on the crimped substrate layers; and pressurizing the crimped substrate layers after removing the organic solvent while heating at a temperature which is higher than the heating temperature and lower than the glass transition temperature or the softening point temperature of the resin.

8. A manufacturing method of a microfluidic chip comprising:

treating a joining surface of one of a first substrate layer and a second substrate layer formed from a resin, having a minute level difference at the joining surface, using an organic solvent having solubility with respect to the resin;

heating the first substrate layer and the second substrate layer after the organic solvent treatment at a heating temperature less than a glass transition temperature or a softening point temperature of the resin and crimping the heated substrate layers together;

removing the organic solvent remaining on the crimped substrate layers; and pressurizing the crimped substrate layers after removing the organic solvent while heating at a temperature which is higher than the heating temperature and lower than the glass transition temperature or the softening point temperature of the resin, wherein the level difference is sealed by the resin.

9. A fusing apparatus of a substrate layer comprising:

a dissolving unit that treats a joining surface of one of a first substrate layer and a second substrate layer formed from a resin using an organic solvent having solubility with respect to the resin;

a crimping unit that heats the first substrate layer and the second substrate layer after the organic solvent treatment at a heating temperature less than a glass transition temperature or a softening point temperature of the resin and crimps the heated substrate layers together;

a drying mechanism that removes the organic solvent remaining on the crimped substrate layers; and a pressurizing unit that pressurizes the crimped substrate layers after removing the organic solvent while heating at a temperature which is higher than the heating temperature and lower than the glass transition temperature of the resin in the crimping unit.

* * * * *